United States Patent
Matsunaga et al.

(10) Patent No.: US 9,696,068 B2
(45) Date of Patent: Jul. 4, 2017

(54) COOLING APPARATUS, HEAT RECEIVING SECTION AND BOILING SECTION USED THEREIN, AND METHOD OF MANUFACTURING THE SAME

(71) Applicant: NEC Corporation, Tokyo (JP)

(72) Inventors: Arihiro Matsunaga, Tokyo (JP); Minoru Yoshikawa, Tokyo (JP); Hitoshi Sakamoto, Tokyo (JP); Akira Shoujiguchi, Tokyo (JP); Masaki Chiba, Tokyo (JP); Kenichi Inaba, Tokyo (JP)

(73) Assignee: NEC Corporation, Tokyo (JP)

( * ) Notice: Subject to any disclaimer, the term of this patent is extended or adjusted under 35 U.S.C. 154(b) by 172 days.

(21) Appl. No.: 14/427,487

(22) PCT Filed: Jul. 19, 2013

(86) PCT No.: PCT/JP2013/070262
§ 371 (c)(1),
(2) Date: Mar. 11, 2015

(87) PCT Pub. No.: WO2014/045714
PCT Pub. Date: Mar. 27, 2014

(65) Prior Publication Data
US 2015/0241096 A1    Aug. 27, 2015

(30) Foreign Application Priority Data

Sep. 19, 2012  (JP) ................................. 2012-205801

(51) Int. Cl.
| | |
|---|---|
| *F25B 39/02* | (2006.01) |
| *H01L 23/427* | (2006.01) |
| *B23P 15/26* | (2006.01) |

(52) U.S. Cl.
CPC ............ *F25B 39/028* (2013.01); *B23P 15/26* (2013.01); *H01L 23/427* (2013.01); *H01L 2924/0002* (2013.01); *Y10T 29/49359* (2015.01)

(58) Field of Classification Search
CPC ...... F25B 39/028; B23P 15/26; H01L 23/427; H01L 2924/0002; Y10T 29/49359
See application file for complete search history.

(56) References Cited

U.S. PATENT DOCUMENTS

| | | | |
|---|---|---|---|
| 4,825,661 A * | 5/1989 | Holtzapple | ............. F25B 39/02 165/104.26 |
| 6,082,443 A | 7/2000 | Yamamoto et al. | |

(Continued)

FOREIGN PATENT DOCUMENTS

| | | |
|---|---|---|
| CN | 101894812 A | 11/2010 |
| EP | 1383170 A2 | 1/2004 |

(Continued)

OTHER PUBLICATIONS

International Search Report issued in PCT/JP2013/070262, mailed Oct. 22, 2013, 2 pages—English Translation.

(Continued)

*Primary Examiner* — David Hwu
(74) *Attorney, Agent, or Firm* — Wilmer Cutler Pickering Hale and Dorr LLP (57) ABSTRACT

In order to maintain a high cooling capability even in a case where a heating element has a lower calorific value, a boiling section of a heat receiving section in a phase change cooling apparatus includes a comb-shaped structure and a porous layer provided on a bottom portion of the comb-shaped structure between fins of the comb-shaped structure. With such a boiling section, a liquid film of a liquid phase refrigerant is forcedly made thinner. Thus, the liquid phase refrigerant is changed in phase into a gaseous phase refrig- (Continued)

erant even in a case of a small difference between the temperature of the gaseous phase refrigerant and the temperature of the heat receiving surface.

8 Claims, 3 Drawing Sheets

(56) References Cited

U.S. PATENT DOCUMENTS

| | | | |
|---|---|---|---|
| 2003/0136550 A1 | 7/2003 | Tung et al. | |
| 2004/0011511 A1 | 1/2004 | Ghosh et al. | |
| 2006/0196640 A1* | 9/2006 | Siu | F28D 15/046 165/104.26 |
| 2011/0088875 A1* | 4/2011 | Hou | F28D 15/0266 165/104.26 |
| 2011/0240263 A1* | 10/2011 | Yu | F28D 15/0233 165/104.26 |
| 2013/0319639 A1 | 12/2013 | Sakamoto et al. | |

FOREIGN PATENT DOCUMENTS

| | | |
|---|---|---|
| EP | 1383170 | 7/2007 |
| JP | A-H10-47889 | 2/1998 |
| JP | A-H11-330329 | 11/1999 |
| JP | U-3086493 | 6/2002 |
| JP | A-2002-286384 | 10/2002 |
| JP | A-2002-314013 | 10/2002 |
| JP | A-2004-056151 | 2/2004 |
| JP | A-2010-002125 | 1/2010 |
| KR | 2010-0135541 A | 12/2010 |
| WO | WO-2012/115214 A1 | 8/2012 |

OTHER PUBLICATIONS

Russian Office Action issued by the Russian Federal Service for Intellectual Property Office for Application No. 2015114588/ (022754) dated Jun. 9, 2016 (14 pages).

Extended European Search Report issued by the European Patent Office for Application No. 13839968.8 dated May 18, 2016 (10 pages).

* cited by examiner

COOLING APPARATUS, HEAT RECEIVING SECTION AND BOILING SECTION USED THEREIN, AND METHOD OF MANUFACTURING THE SAME

CROSS REFERENCE TO RELATED APPLICATIONS

This application is a national stage application of International Application No. PCT/JP2013/070262, filed Jul. 19, 2013, which claims the benefit of priority to Japanese Patent Application No. 2012-205801, filed Sep. 19, 2012, the disclosures of which are hereby incorporated by reference in their entirety.

In the Description:

TECHNICAL FIELD

The present invention relates to a cooling apparatus for cooling a heating element such as an electronic component. More particularly, the present invention relates to a boiling section for boiling a liquid phase refrigerant to change the liquid phase refrigerant in phase into a gaseous phase refrigerant, to a heat receiving section including such a boiling section, to a phase change cooling apparatus having such a heat receiving section, and a method of manufacturing such a boiling section.

BACKGROUND ART

In recent years, a large amount of data needs to be collected and processed. Thus, a large amount of information is processed within a limited space. Therefore, the heating density of electronic components such as a CPU (central processing unit) increases. Electronic components cannot effectively demonstrate their effects (performance) unless they are cooled. In some cases, if an electronic component is not cooled, it is broken to cause many problems. A cooling apparatus that utilizes a phase change of a refrigerant to transport and diffuse heat for cooling (hereinafter referred to as "phase change cooling apparatus") has been proposed as means for cooling an electronic component having a high heating density.

Next, an operation of the phase change cooling apparatus will briefly be described. The phase change cooling apparatus comprises a heat receiving section that receives heat from a heating element of an electronic component such as a CPU, a heat radiation section that radiates the transported heat by using a phase change of a refrigerant, and a pipe connecting the heat receiving section and the heat radiation section to each other.

The heat receiving section is thermally connected to the heating element with heat conduction grease. The heat radiation section is provided with an externally provided cooler such as a cooling fan. Thus, heat radiation is promoted from the heat radiation section to the air.

In the heat receiving section that receives heat from the heating element, a liquid phase refrigerant in the heat receiving section boils with the heat transmitted from the heating element, so that the liquid phase refrigerant changes in phase into a gaseous phase refrigerant. When the liquid phase refrigerant changes in phase into a gaseous phase refrigerant, the refrigerant absorbs therein the heat as latent heat. Because a gaseous phase refrigerant has a lower density than a liquid phase refrigerant, the gaseous phase refrigerant ascends due to its buoyancy and moves to the heat radiation section through a gaseous phase pipe. Since the buoyancy is used to move the gaseous phase refrigerant to the heat radiation section, the heat radiation section needs to be located at a vertically upward position with respect to the heat receiving section.

The gaseous phase refrigerant that has moved to the heat radiation section radiates heat to the air with cooling air delivered from a cooling fan externally provided. Thus, the gaseous phase refrigerant changes in phase into a liquid phase refrigerant. Since a liquid phase refrigerant has a higher density than a gaseous phase refrigerant, the liquid phase refrigerant descends due to the gravity and returns to the heat receiving section through a liquid phase pipe. The returned liquid phase refrigerant is supplied with heat and reused for circulation of the refrigerant.

In this manner, the phase change cooling apparatus uses the phase change of a refrigerant and can thus circulate the refrigerant without any pump. Furthermore, the amount of heat per unit mass that can be transported by the phase change is as large as several hundred times the amount of heat per unit mass that is obtained by a method of transporting heat with a temperature increase of a refrigerant such as water-cooling. Therefore, the method using the phase change is suitable for transporting and cooling heat having higher calorific values.

Although the phase change cooling apparatus is suitable for transporting and cooling heat having higher calorific values, recent high densification of electronic devices has required higher performance of the phase change cooling apparatus. In order to use a phase change cooling apparatus for highly densified electronic devices, the entire phase change cooling apparatus should not be increased in size because electronic devices have only limited areas for a cooling apparatus. Accordingly, it is desired to enhance the performance of the heat receiving section more than the heat radiation section, which greatly depends upon a radiation area. In order to enhance the performance of the heat receiving section, it is important to boil a large amount of a liquid phase refrigerant without an increased difference in temperature between the boiling section, which receives heat from the heating element and boils a liquid phase refrigerant into a gaseous phase refrigerant, and the gaseous phase refrigerant.

Various types of boiling means with a small temperature difference have heretofore been proposed.

For example, in FIG. 12(b) of Patent Literature 1, a spherical boiling section structure with an opening portion is used. This structure has a wedge-shaped portion, which is effective for boiling, to form irregularities that are effective for formation of bubble cores. Thus, the structure increases the number of bubbles generated for improvement. Generally, in order to form bubble cores, bubbles are trapped by this wedge-shaped portion, so that the bubbles press a liquid film against an inner wall of the wedge-shaped portion to make the liquid film thinner. The thinned liquid film quickly boils with a small temperature difference. Therefore, the wedge-shaped portion by which the bubbles are trapped serves as a bubble core generation portion.

FIG. 5 of Patent Literature 2 shows that a surface of a fin-like groove structure is covered with a thin porous member by electroplating or the like so as to increase the friction of the surfaces of the grooves. Thus, bubbles are trapped so that a liquid phase refrigerant is pressed against wall surfaces of the grooves by those bubbles to form a thin liquid film. When heat of a heating element is applied to the thin liquid film on the surfaces of the grooves, the liquid phase refrigerant can boil quickly, which improves the cooling capability.

PRIOR ART LITERATURE

Patent Literature

Patent Literature 1: JP-A-H10-47889 (FIG. 12(b); [0023])
Patent Literature 2: JP-A-H 11-330329 (FIG. 5; [0035])

SUMMARY OF INVENTION

Problem(s) to be Solved by Invention

Heating elements such as CPUs have varying calorific values depending upon the amount of information to be processed. When the calorific value decreases as the amount of information to be processed becomes smaller, the electric power consumption accordingly needs to be reduced by reducing the amount of cooling air supplied by an external cooling fan.

With the aforementioned structures, however, the size of bubbles being generated changes as the calorific value varies. Therefore, bubbles may not be trapped with a wedge-shaped portion shown in FIG. 12(b) of Patent Literature 1 or within grooves having a thin porous layer shown in FIG. 5 of Patent Literature 2, so that the cooling capability is lowered. As a result, even if the calorific value of a heating element decreases, the cooling power required for a cooling fan or the like cannot be reduced. Accordingly, there is a problem that an electronic device continuously needs a high cooling power.

Object of Invention

It is an object of the present invention to maintain a high cooling capability of a phase change cooling apparatus even if a heating element has a lower calorific value.

Means for Solving Problem(s)

A boiling section of a phase change cooling apparatus according to the present invention comprises a comb-shaped structure with fins and a porous layer provided on a bottom portion between the fins of the comb-shaped structure.

Advantageous Effects of Invention

What is a first advantageous effect of the present invention is that the cooling capability can be improved by forming a thin liquid film with a porous layer.

What is a second advantageous effect of the present invention is that the cooling capability can be maintained because a liquid film is not thickened in a porous layer even in a case where a heating element has a lower calorific value.

EMBODIMENT(S) FOR CARRYING OUT THE INVENTION

Exemplary embodiments of the present invention will be described in detail with reference to the drawings.

First Exemplary Embodiment

Figure 1:
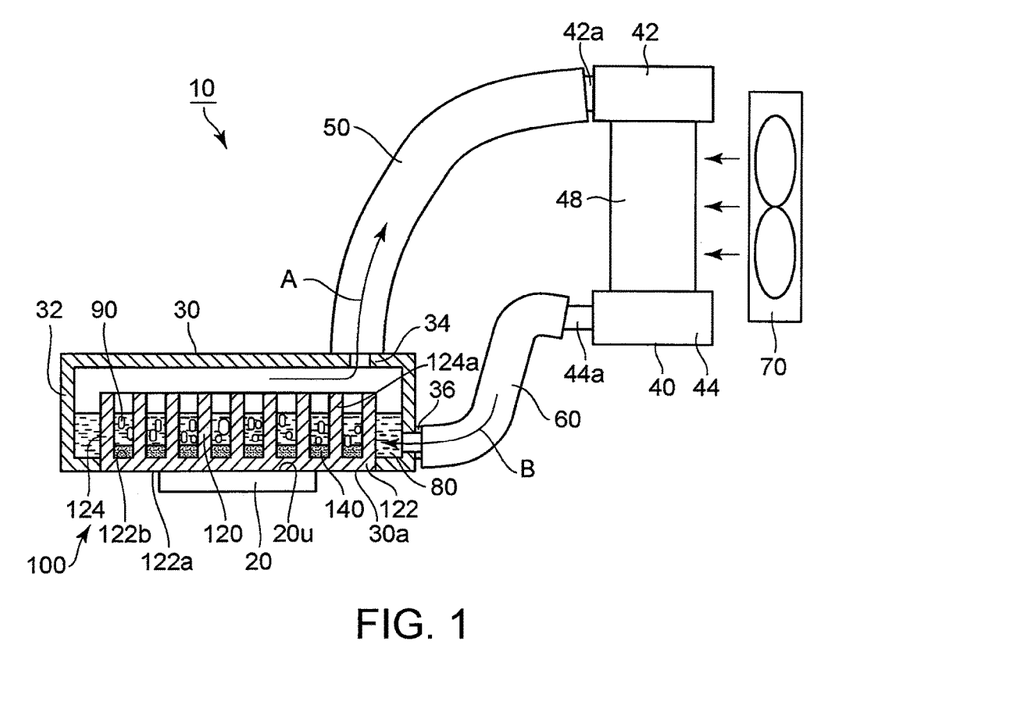
FIG. 1 is a diagram showing a configuration of a cooling apparatus according to a first exemplary embodiment of the present invention.
Figure 2:
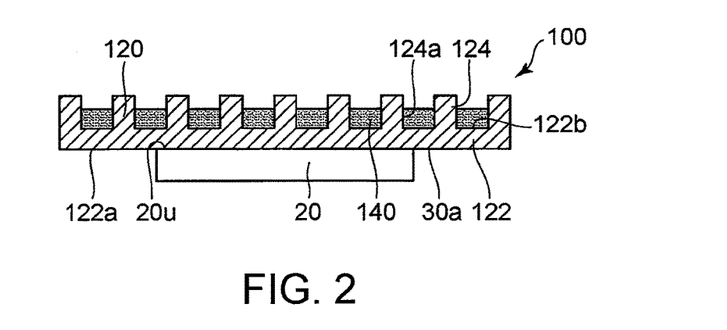
FIG. 2 is a cross-sectional view showing a boiling section used in the cooling apparatus shown in FIG. 1.

FIG. 1 is a diagram showing, partially in cross-section, a configuration of a phase change cooling apparatus 10 according to a first exemplary embodiment of the present invention. FIG. 2 is a cross-sectional view of a boiling section 100 used in the phase change cooling apparatus 10 shown in FIG. 1.

First, a configuration and an operation of the phase change cooling apparatus 10 will briefly be described with reference to FIG. 1. The phase change cooling apparatus 10 comprises a heat receiving section 30 that receives heat from a heating element 20, a heat radiation section 40 that radiates the transported heat by using a phase change of a refrigerant, and a gaseous phase pipe 50 and a liquid phase pipe 60 that connect the heat receiving section and the heat radiation section to each other.

In the illustrated example, the heating element 20 comprises an electronic component such as a CPU. Furthermore, the heating element 20 has a surface (upper surface) $20u$ extending in a horizontal direction. Therefore, the heat receiving section 30 has a heat receiving surface $30a$ extending in the horizontal direction so that the heat receiving surface $30a$ is thermally connected to (or brought into contact with) the surface (upper surface) $20u$ of the heating element 20.

The heat receiving surface $30a$ of the heat receiving section 30 is thermally connected to the surface (upper surface) $20u$ of the heating element 20 with heat conduction grease or the like. In the heat radiation section 40, a cooler such as a cooling fan 70 is externally provided so as to promote heat radiation from the heat radiation section 40 into the air.

The heat receiving section 30, which receives heat from the heating element 20, includes therein a boiling section 100 that boils a liquid phase refrigerant 80 therein with heat transmitted from the heating element 20 so as to change the liquid phase refrigerant 80 in phase into a gaseous phase refrigerant 90. The configuration of the boiling section 100 will be described in greater detail later with reference to FIG. 2.

When the liquid phase refrigerant 80 changes in phase into the gaseous phase refrigerant 90, the refrigerant absorbs therein the heat as latent heat. Because the gaseous phase refrigerant 90 has a lower density than the liquid phase refrigerant 80, it ascends due to its buoyancy and moves to the heat radiation section 40 through the gaseous phase pipe 50 as indicated by the arrow A in FIG. 1. Since the buoyancy is used to move the gaseous phase refrigerant 90 to the heat radiation section 40, the heat radiation section 40 needs to be located at a vertically upward position with respect to the heat receiving section 30.

The gaseous phase refrigerant 90 that has moved to the heat radiation section 40 radiates heat to the air by cooling air delivered from the cooling fan 70 externally provided. Thus, the gaseous phase refrigerant changes in phase into a liquid phase refrigerant 80. Since the liquid phase refrigerant 80 has a higher density than the gaseous phase refrigerant 90, it descends due to the gravity and returns to the heat receiving section 30 through the liquid phase pipe 60 as indicated by the arrow B in FIG. 1. The returned liquid phase refrigerant 80 is supplied with heat from the heating element 20 and reused for circulation of the refrigerant.

In this manner, the phase change cooling apparatus 10 uses the phase change of a refrigerant and can thus circulate the refrigerant 80 and 90 without any pump. Furthermore, the amount of heat per unit mass that can be transported by the phase change is as large as several hundred times the amount of heat per unit mass that is obtained by a method of transporting heat with a temperature increase of a refrigerant such as water-cooling. Therefore, the method using the phase change is suitable for transporting and cooling heat having higher calorific values.

Referring to FIG. 2, the boiling section 100 comprises a comb-shaped structure 120 and a porous layer 140. The comb-shaped structure 120 comprises a bottom portion 122 extending substantially in the horizontal direction and a number of fins extending substantially in the vertically upward direction from the bottom portion 122. The porous layer 140 is formed on the bottom portion 122 between the fins 124 of the comb-shaped structure 120.

The bottom portion 122 of the comb-shaped structure 120 has an outside bottom surface 122*a*, which forms the heat receiving surface 30*a* of the heat receiving section 30.

Next, an operation of the boiling section 100 will be described.

The boiling section 100 according to the first exemplary embodiment of the present invention is housed in and used within the heat receiving section 30. The interior of the heat receiving section 30 is filled with a sufficient amount of the liquid phase refrigerant 80. When the liquid phase refrigerant 80 is brought into contact with the porous layer 140, it permeates into the porous layer 140 due to capillary forces caused by the surface tension of the liquid phase refrigerant 80 and the weight of the liquid phase refrigerant 80. The liquid phase refrigerant 80 permeates into open spaces (holes) 142*a* of the porous layer 140 (see FIG. 3). The open spaces (holes) 142*a* of the porous layer 140 are so narrow that the liquid phase refrigerant 80 is forcedly formed into a thin liquid film.

Furthermore, since the porous layer 140 has a large number of openings (holes) 142*a*, the thermal conductivity of the porous layer 140 is low in a case where the heating element has a lower calorific value. Therefore, a sufficient amount of heat cannot be transferred to the liquid phase refrigerant 80 in the porous layer 140 in the case where the heating element has a lower calorific value. When the porous layer 140 is formed between the fins 124 of the comb-shaped structure 120 as in the first exemplary embodiment of the present invention, heat can be transferred to the porous layer 140 not only through inside bottom surfaces 122*b* of the bottom portion 122 of the comb-shaped structure 120, but also through sidewall surfaces 124*a* of the fins 124. Accordingly, the boiling can be promoted in a range where the heating element has lower calorific values.

It is preferable to form the comb-shaped structure 120 of a metallic material having a high thermal conductivity, such as aluminum or copper. Nevertheless, the material of the comb-shaped structure is not limited to a metallic material. This comb-shaped structure 120 is manufactured by shaving a metal block with machining or by cutting the metal block and forming a number of rising fins 124 with pressing and the like.

The sidewall surfaces 124*a* of the fins 124 may not be perpendicular to the inside bottom surfaces 122*b* of the bottom portion 122. Thus, the fins 124 may be curved, or the bottom portion 122 may be inclined between the fins 124.

As described later, the thickness of the fins 124 should be equal to or greater than the diameter of the holes in the porous layer 140 in order to efficiently transfer heat to the porous layer 140 located on the bottom portion 122 between the fins 124. Additionally, the thickness of the fins 124 should be determined such that an area of the porous layer 140 that is brought into contact with the bottom portion 122 between all of the fins 124 of the comb-shaped structure 120 is equal to or greater than an area of the heating element 20 that is brought into contact with the outside bottom surface 122*a* (heat receiving surface 30*a*) of the bottom portion 122 of the comb-shaped structure 120. Specifically, it is preferable to set the thickness of the fins 124 in a range of about 0.05 mm to about 2 mm.

The intervals between adjacent fins 124 are set such that an area of the comb-shaped structure 120 that is brought into contact with the porous layer 140 is equal to or greater than an area of the heating element 20 that is brought into contact with the outside bottom surface 122*a* (heat receiving surface 30*a*) of the bottom portion 122 of the comb-shaped structure 120. Specifically, it is preferable to set the intervals between adjacent fins 124 in a range of about 0.1 mm to about 2 mm.

Figure 3:
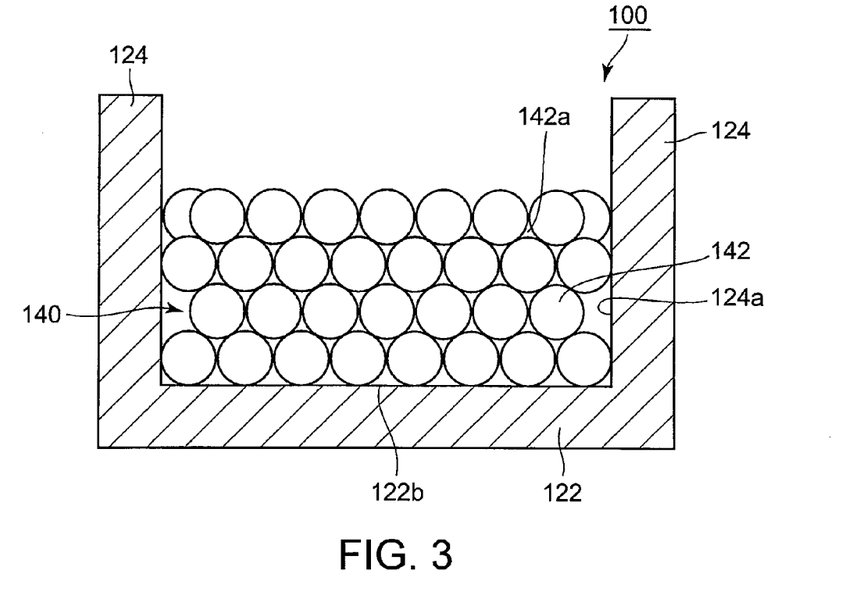
FIG. 3 is a cross-sectional view showing the detail of a porous layer in the boiling section shown in FIG. 2.

As shown in FIG. 3, the porous layer 140 comprises a large number of fine particles 142 spreading over the porous layer with a large number of holes 142*a* being formed between those fine particles 142. Those fine particles 142 are thermally connected to each other. Thus, the fine particles 142 conduct heat from the bottom portion 122 between the fins 124 of the comb-shaped structure 120 in the boiling section 100 and from the sidewall surfaces 124*a* of the fins 124, and transfer the heat to the liquid phase refrigerant 80 that has permeated between the fine particles 142. Therefore, it is preferable to form the fine particles 142 of copper or aluminum, which has a high thermal conductivity. Nevertheless, the material of the fine particles is not limited to copper or aluminum as long as the fine particles 142 can have porosity.

This porous layer 140 is formed by mixing the fine particles 142 with a binder to form a mixture, by stacking the mixture on the bottom portion 122 of the comb-shaped structure 120, and by sintering the mixture. At that time, a liquid for diffusion volatilizes, so that a porous layer 140 having a large number of holes 142*a* can be formed.

Furthermore, a porous member may be formed separately from the comb-shaped structure 120 by sintering the aforementioned mixture and then stacked on the bottom portion 122 of the comb-shaped structure 120 to thereby form a porous layer 140 on the bottom portion 122 of the comb-shaped structure 120. In such a case, the porous member can individually be mass-produced. Therefore, the economies of mass production are likely to be achieved, and advantages can be obtained in cost reduction.

The thickness of the porous layer 140 should be set such that the liquid phase refrigerant 80 is formed into a thin film so as to improve the cooling capability. If the thickness of the porous layer 140 is excessively thin, the liquid phase refrigerant 80 needs to change in phase into the gaseous phase refrigerant 90 before the liquid phase refrigerant 80 is satisfactorily formed into a thin liquid film. As a result, the cooling capability is not improved. Conversely, if the thickness of the porous layer 140 is excessively thick, it takes time for the liquid phase refrigerant 80 to permeate into the porous layer 140. Thus, heat cannot be received near the heat receiving surface 30a. Furthermore, it takes time for the gaseous phase refrigerant 90 generated in the porous layer 140 to leave the porous layer 140. As a result, the cooling capability is not improved. Therefore, in order to demonstrate a desired function, the thickness of the porous layer 140 should be equal to or greater than the diameter of the holes 142a of the porous layer 140 and be equal to or less than the length of fins 124. Specifically, the optimal thickness of the porous layer 140 is preferably in a range of about 0.005 mm to about 2 mm.

The holes 142a of the porous layer 140 have such a size that molecules of the liquid phase refrigerant 80 can permeate into the porous layer 140 and that a thin liquid film of the liquid phase refrigerant 80 is allowed to be formed. In order to demonstrate a desired function, the diameter of the holes 142a of the porous layer 140 should be equal to or greater than the diameter of molecules of the refrigerant and be equal to or less than the intervals between adjacent fins 124. Specifically, the optimal diameter of the holes 142a of the porous layer 140 is preferably in a range of about 1 μm to about 1.5 mm.

As shown in FIG. 1, a cover 32 is attached to the boiling section 100 having such a structure, so that the heat receiving section 30 is formed. The heat receiving section 30 is connected to the external heat radiation section 40 via the gaseous phase pipe 50 and the liquid phase pipe 60.

The boiling section 100 and the cover 32 of the heat receiving section 30 are bonded to each other and hermetically sealed by welding or brazing so that the refrigerant does not leak out. A gasket made of silicone or the like may be interposed between the boiling section 100 and the cover 32, pressed by a screw or the like, and hermetically sealed. In this case, repair of the boiling section 100 and the like can advantageously be made with ease.

This heat receiving section 30 has two nozzles 34 and 36 for connection to the heat radiation section 40 through the gaseous phase pipe 50 and the liquid phase pipe 60. The gaseous phase pipe 50, which transfers the gaseous phase refrigerant 90 generated in the heat receiving section 30 to the heat radiation section 40, is attached to the nozzle 34 located at a vertically upper position. The liquid phase pipe 60, which returns the liquid phase refrigerant 80 generated in the heat radiation section 40 to the heat receiving section 30, is attached to the nozzle 36 located at a vertically lower position. The heating element 20 is thermally connected to the heat receiving surface 30a as a lower surface of the heat receiving section 30 with heat conduction grease or the like. The boiling section 100 is provided right above the heat receiving surface 30a in order to quickly transmit and transport heat to the refrigerant.

The heat radiation section 40 comprises headers 42 and 44 at opposite ends with nozzles 42a and 44a to which the gaseous phase pipe 50 and the liquid phase pipe 60 are connected, a plurality of heat radiation tubes (not shown) having openings communicating with the headers 42 and 44, and a number of heat radiation fins 48 provided between the heat radiation tubes.

The phase change cooling apparatus 10 utilizes the gravity to circulate the refrigerant for cooling, which will be described later. Therefore, the heat radiation section 40 needs to be located at a position that is vertically upper than a position of the heat receiving section 30.

The gaseous phase pipe 50 and the liquid phase pipe 60 communicate between the heat receiving section 30 and the heat radiation section 40. The gaseous phase pipe 50 and the liquid phase pipe 60 are preferably formed of a metal pipe because internal spaces of the gaseous phase pipe and the liquid phase pipe should be hermetically sealed to prevent leakage of the refrigerant in order to ensure the reliability. When the gaseous phase pipe 50 and the liquid phase pipe 60 are formed of a metal pipe, a highly reliable connection structure can be provided by connecting the gaseous phase pipe 50 and the liquid phase pipe 60 to the nozzles 34, 36, 42a, and 44a of the heat receiving section 30 and the heat radiation section 40 by welding or brazing. Furthermore, O-rings may be provided for hermetically sealing between the nozzles 34, 36, 42a, and 44a of the heat receiving section 30 and the heat radiation section 40, the gaseous phase pipe 50, and the liquid phase pipe 60. Use of O-rings facilitates the manufacturing of the apparatus.

Furthermore, the nozzles 34, 36, 42a, and 44a of the heat receiving section 30 and the heat radiation section 40 may be inserted into the gaseous phase pipe 50 and the liquid phase pipe 60. Part of the gaseous phase pipe 50 and the liquid phase pipe 60 or part of the nozzles 34, 36, 42a, and 44a may be plastically deformed with use of a ring-like part. Thus, the nozzles 34, 36, 42a, and 44a may be brought into intimate contact with the gaseous phase pipe 50 and the liquid phase pipe 60. In this case, the nozzle 34, 36, 42a, and 44a can be brought into intimate contact with the gaseous phase pipe 50 and the liquid phase pipe 60 without O-rings. Therefore, advantages can be obtained in cost reduction. Furthermore, when an organic refrigerant is used in the apparatus, degradation of the refrigerant or the like can be prevented because no O-rings are used.

If the heat receiving section 30 includes a sufficient amount of refrigerant, it serves as a tank. Therefore, a rubber tube may be used for the gaseous phase pipe 50 and the liquid phase pipe 60. In this case, the gaseous phase pipe 50 and the liquid phase pipe 60 have flexibility. Therefore, the gaseous phase pipe 50 and the liquid phase pipe 60 can readily be bent, which is advantageous in assembling the phase change cooling apparatus. Furthermore, the connection to the nozzles 34, 36, 42a, and 44a can be implemented only by clamp or the like, which is also advantageous in manufacturing the phase change cooling apparatus.

The cooling fan 70 or the like is arranged outside of the heat radiation section 40. Cooling air is directed to the heat radiation fins 48 of the heat radiation section 40 so as to radiate heat of the gaseous phase refrigerant 90 transported from the heat receiving section 30 to the air.

The phase change cooling apparatus 10 is constructed in this manner. It is preferable to use an insulative refrigerant when the phase change cooling apparatus is used for electronic devices. In this case, if an internal refrigerant should leak out, influence on other parts can be reduced. The insulative refrigerant is injected through an injection port (not shown) into the phase change cooling apparatus 10 thus constructed. The insulative refrigerant is subject to hermetically sealing by closing valves after evacuation. At that time, the injection port may be hermetically sealed by caulking or welding.

Next, an operation of the phase change cooling apparatus 10 according to the first exemplary embodiment of the present invention will be described in detail.

Figure 4:
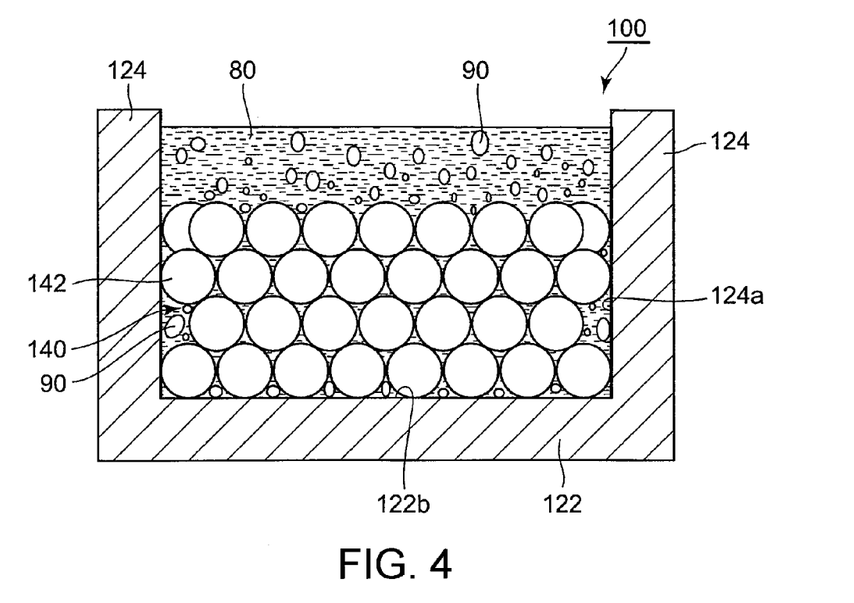
FIG. 4 is a cross-sectional view explanatory of an operation of the porous layer at the time of boiling in the boiling section shown in FIG. 2.

FIG. 4 is an operational diagram showing boiling in the boiling section 100 of the phase change cooling apparatus 10 according to the first exemplary embodiment of the present invention.

As described above, the boiling section 100 of the phase change cooling apparatus 10 according to the first exemplary embodiment of the present invention comprises a porous layer 140 provided on the bottom portion 122 between the fins 124 of the comb-shaped structure 120. Since the heat receiving section 30 including the boiling section 100 is filled with the liquid phase refrigerant 80, the boiling section 100 is immersed in the liquid phase refrigerant 80. The liquid phase refrigerant 80 that is brought into contact with the porous layer 140 permeates into the porous layer 140 due to capillary forces caused by the surface tension of the refrigerant and the weight of the refrigerant. Since the porous layer 140 has a structure having a large number of small holes 142a defined therein, the permeating refrigerant is forcedly formed into a thin liquid film.

Furthermore, since the porous layer 140 is provided between the fins 124, heat received from the heat receiving surface 30a can be supplied to the porous layer 140 through the inside bottom surfaces 122b of the bottom portion 122 and the vicinity of the sidewall surfaces 124a of the fins 124. Thus, the impairment of the thermal conductivity caused by a large number of holes 142a arranged in the porous layer 140 can be reduced. The heat received by the porous layer 140 is transferred to the liquid phase refrigerant 80 that has forcedly been formed into a thin liquid film within the porous layer 140.

The liquid phase refrigerant 80 in the form of a thin liquid film quickly increases in temperature to a boiling point, boils, and changes in phase into the gaseous phase refrigerant 90 even if the temperature of the gaseous phase refrigerant 90 and the temperature of the walls have small differences. Since the gaseous phase refrigerant 90 that has changed in phase has a low density, it leaves the porous layer 140 due to its buoyancy, passes through the gaseous phase pipe 50, and moves to the heat radiation section 40. Due to the capillary forces and the weight of the refrigerant, the liquid phase refrigerant 80 quickly permeates into an area of the porous layer 140 from which the gaseous phase refrigerant 90 has left. Then the liquid phase refrigerant 80 receives heat again and changes in phase into the gaseous phase refrigerant 90. The heat of the heating element 20 is used for the phase change of the refrigerant and is transported by the moving refrigerant.

The gaseous phase refrigerant 90 that has passed through the gaseous phase pipe 50 and moved to the heat radiation section 40 passes through the header 42, diffuses therein, and flows into respective heat radiation tubes in the heat radiation section 40. Heat is removed from the gaseous phase refrigerant 90 that has flowed into the heat radiation tubes by cooling air from the external cooling fan 70. Thus, the gaseous phase refrigerant 90 changes in phase into the liquid phase refrigerant 80. The liquid phase refrigerant 80 that has changed in phase descends due to its weight, passes through the liquid phase pipe 60, and flows back to the heat receiving section 30.

Thus, heat is diffused by using the phase change of a refrigerant, so that a large cooling capacity can be obtained. Furthermore, a refrigerant can be circulated without use of a pump. Therefore, this apparatus is advantageous in electric power for cooling as compared to a water-cooling system in which a refrigerant is similarly circulated.

Second Exemplary Embodiment

Next, a boiling section 100A used in a phase change cooling apparatus according to a second exemplary embodiment of the present invention will be described with reference to FIG. 5.

Figure 5:
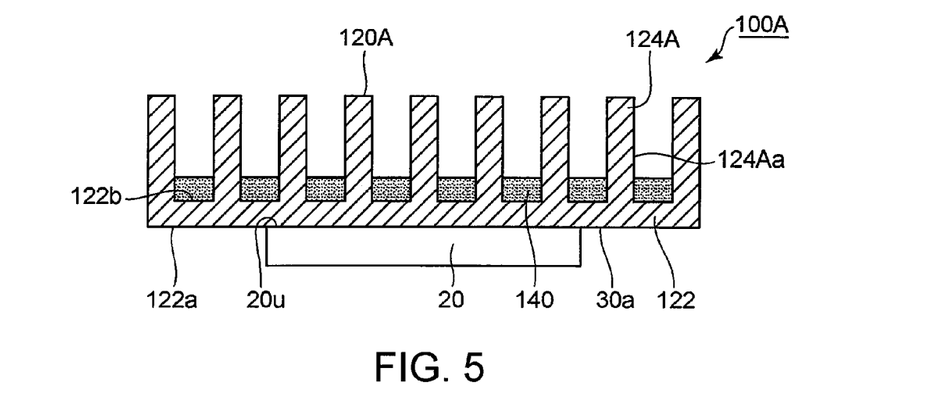
FIG. 5 is a cross-sectional view showing a boiling section used in a cooling apparatus according to a second exemplary embodiment of the present invention.

As shown in FIG. 5, the boiling section 100A of the second exemplary embodiment comprises a comb-shaped structure 120A with fins 124A that extend longer than the fins 124 in the boiling section 100 of the first exemplary embodiment.

The extended fins 124A of the comb-shaped structure 120A can improve the cooling capability for higher calorific values.

In the case where the heating element has a higher calorific value, the amount of the gaseous phase refrigerant 90 generated from the porous layer 140 also increases. However, the porous layer 140 is a passage resistance to the gaseous phase refrigerant 90. Therefore, when a large amount of the gaseous phase refrigerant 90 is generated, the cooling capability is lowered on the contrary.

Accordingly, as shown in FIG. 5, the extended fins 124A of the comb-shaped structure 120A can improve the cooling capability without lowering the cooling capability.

Figure 6:
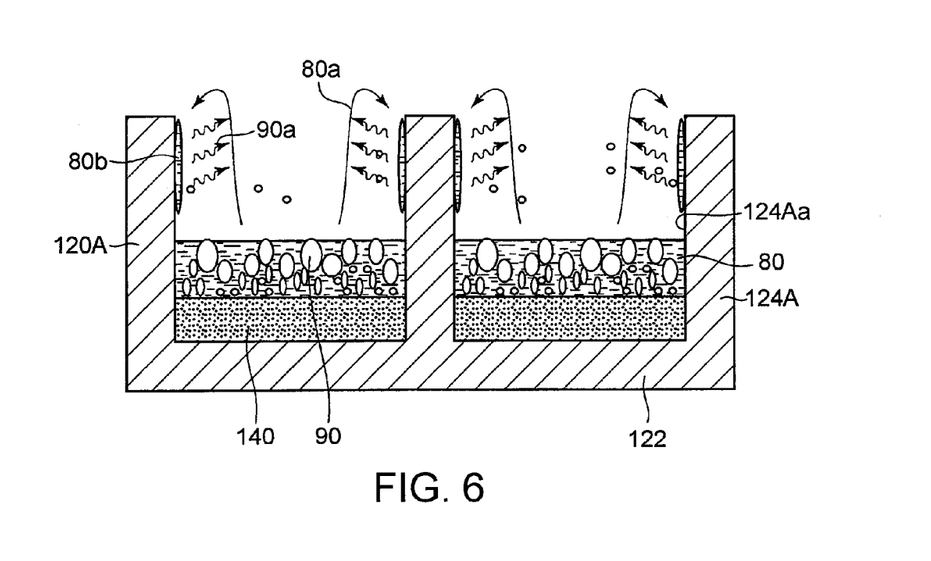
FIG. 6 is a cross-sectional view explanatory of an operation of the boiling section shown in FIG. 5 in a case where a heating element has a higher calorific value.

Now an operation of the apparatus in a case where the heating element has a higher calorific value will be described in detail with reference to FIG. 6. In a case where the heating element has a higher calorific value, a large amount of the gaseous phase refrigerant 90 is generated in the porous layer 140 as described above. Therefore, the gaseous phase refrigerant 90 ascends along with the liquid phase refrigerant 80a that is present above the porous layer 140. The liquid phase refrigerant 80a that has ascended with the gaseous phase refrigerant 90 descends due to its weight. At that time, part of the liquid phase refrigerant 80a attaches to sidewall surfaces 124Aa of the fins 124A. The liquid phase refrigerant 80b that has attached to the sidewall surfaces 124Aa flows down on the sidewall surfaces 124Aa. Accordingly, a thin liquid film can also be formed on the sidewall surfaces 124Aa of the fins 124A. The sidewall surfaces 124Aa is not covered with the porous layer 140 because a porous layer 140 covering the sidewall surfaces 124Aa would prevent the liquid refrigerant 80b from flowing on the sidewall surfaces 124Aa of the fins 124A. When this liquid phase refrigerant 80b in the form of a thin liquid film receives heat conducted through the fins 124A from the heat receiving surface 30a, the liquid phase refrigerant 80b quickly deprives the heat and changes in phase into a gaseous phase refrigerant 90a. The gaseous phase refrigerant 90a that has changed in phase ascends due to its buoyancy, passes through the gaseous phase pipe 50, and moves to the heat radiation section 40.

Thus, the extended fins 124A can utilize the lift of the liquid phase refrigerant 80a, which is caused by a large amount of the gaseous phase refrigerant 90 generated in the case where the heating element has a higher calorific value, so as to use heat more efficiently for the phase change of the refrigerant. Therefore, the cooling capability is not impaired and can be increased.

If the length of the fins 124A is excessively short, the liquid phase refrigerant 80b that flows down on the sidewall surfaces 124Aa of the fins 124A cannot be formed into a liquid film. If the length of the fins 124A is excessively long, the fins 124A inhibit the flow of the gaseous phase refrigerant 90. Specifically, the optimal length of the fins 124A is preferably in a range of about 2 mm to about 15 mm.

Third Exemplary Embodiment

Next, a boiling section used in a phase change cooling apparatus according to a third exemplary embodiment of the present invention will be described.

In the boiling section of the third exemplary embodiment, the surface of the extended fins 124A in the boiling section 100A according to the second exemplary embodiment as shown in FIG. 5 is roughened by sandblasting or the like.

When the porous layer 140 is provided on the wall surfaces 124Aa of the fins 124A, the passage resistance of the porous layer 140 inhibits the liquid refrigerant 80b from flowing on the wall surfaces 124Aa of the fins 124A. Thus, it becomes difficult to efficiently generate a gaseous phase refrigerant 90a from the sidewall surfaces 124Aa of the fins 124A.

Therefore, in the third exemplary embodiment, fine irregularities are provided on the surfaces 124Aa of the fins 124A by sandblasting or the like. Accordingly, the surface area of the fins 124A can be increased by the irregularities while the liquid phase refrigerant 80b is not inhibited from flowing down. Thus, the phase change from the liquid phase refrigerant 80b into the gaseous phase refrigerant 90a can be promoted on the surfaces 124Aa of the fins 124A, resulting in improved cooling capability. Those fine irregularities preferably have a size of several hundreds of micrometers.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims. For example, the aforementioned exemplary embodiments have been described along with an example where the heating element is an electronic component such as a CPU. As a matter of course, however, the heating element is not limited to an electronic component. Furthermore, a cooling apparatus comprising a heat receiving section including a boiling section is not limited to the structure in the aforementioned embodiments and can be applied to various types of cooling apparatuses.

The whole or part of the exemplary embodiments (examples) described above can be described as, but not limited to, the following supplementary notes.

(Supplementary note 1) A boiling section operable to boil a liquid phase refrigerant with heat from a heating element to change the liquid phase refrigerant in phase into a gaseous phase refrigerant, characterized by comprising:

a comb-shaped structure having a bottom portion thermally connected to the heating element and a plurality of fins extending upward from the bottom portion; and a porous layer provided on the bottom portion between the fins of the comb-shaped structure, the porous layer having a number of small openings defined therein.

(Supplementary note 2) The boiling section according to Supplementary note 1, wherein the bottom portion of the comb-shaped structure extends substantially in a horizontal direction, and each of the plurality of fins extends substantially vertically upward.

(Supplementary note 3) The boiling section according to Supplementary note 1 or 2, wherein the comb-shaped structure is formed of a metal material.

(Supplementary note 4) The boiling section according to any one of Supplementary notes 1 to 3, wherein the porous layer is formed of a number of fine particles.

(Supplementary note 5) The boiling section according to any one of Supplementary notes 1 to 4, wherein the length of each of the plurality of fins is greater than the thickness of the porous layer.

(Supplementary note 6) The boiling section according to Supplementary note 5, wherein a sidewall surface of each of the plurality of fins has a roughened surface.

(Supplementary note 7) The boiling section according to any one of Supplementary notes 1 to 6, wherein the thickness of the fins is equal to or greater than the diameter of holes of the porous layer.

(Supplementary note 8) The boiling section according to any one of Supplementary notes 1 to 7, wherein the intervals between adjacent fins are set such that an area of the comb-shaped structure that is brought into contact with the porous layer is equal to or greater than an area of the heating element that is brought into contact with a heat receiving surface of the bottom portion.

(Supplementary note 9) The boiling section according to any one of Supplementary notes 1 to 8, wherein the thickness of the porous layer is equal to or greater than the diameter of holes of the porous layer and is equal to or less than the length of the fins.

(Supplementary note 10) The boiling section according to any one of Supplementary notes 1 to 9, wherein the diameter of holes of the porous layer is equal to or greater than the diameter of molecules of the refrigerant and is equal to or less than the intervals between adjacent fins.

(Supplementary note 11) A heat receiving section including the boiling section according to any one of Supplementary notes 1 to 10.

(Supplementary note 12) A cooling apparatus comprising: the heat receiving section according to Supplementary note 11; a heat radiation section operable to deprive heat from the gaseous phase refrigerant to change the gaseous phase refrigerant in phase into the liquid phase refrigerant; a gaseous phase pipe for transporting the gaseous phase refrigerant in the heat receiving section to the heat radiation section; and a liquid phase pipe for transporting the liquid phase refrigerant in the heat radiation section into the heat receiving section.

(Supplementary note 13) The cooling apparatus according to Supplementary note 12, wherein the heat radiation section is located at a position that is vertically upper than a position of the heat receiving section.

(Supplementary note 14) An electronic device on which the cooling apparatus according to Supplementary note 12 or 13 is mounted.

(Supplementary note 15) The electronic device according to Supplementary note 14, wherein the heating element comprises a CPU.

(Supplementary note 16) A method of manufacturing a boiling section, the method comprising: providing a metal block cutting the metal block and forming a plurality of rising fins from the metal block to produce a comb-shaped structure;

mixing fine particles with a binder to form a mixture;

stacking the mixture on a bottom portion between the fins of the comb-shaped structure; and sintering the mixture to form a porous layer on the bottom portion of the comb-shaped structure.

(Supplementary note 17) A method of manufacturing a boiling section, the method comprising: providing a metal block cutting the metal block and forming a plurality of rising fins from the metal block to produce a comb-shaped structure;

mixing fine particles with a binder to form a mixture;

sintering the mixture to produce a porous member, and stacking the porous member on a bottom portion between the fins of the comb-shaped structure to form a porous layer on the bottom portion of the comb-shaped structure.

DESCRIPTION OF REFERENCE NUMERALS AND SIGNS 10 phase change cooling apparatus
20 heating element
20u surface (upper surface)
30 heat receiving section
30a heat receiving surface
32 cover
34, 36 nozzle
40 heat radiation section
42, 44 header
42a, 44a nozzle
48 heat radiator fin
50 gaseous phase pipe
60 liquid phase pipe
70 cooling fan
80, 80a, 80b liquid phase refrigerant
90, 90a gaseous phase refrigerant
100, 100A boiling section
120, 120A comb-shaped structure
122 bottom portion
122a outside bottom surface
122b inside bottom surface
124, 124A fin
124a, 124Aa sidewall surface
140 porous layer
142 fine particles
142a hole This application is based upon and claims the benefit of priority from Japanese patent application No. 2012-205801, filed on Sep. 19, 2012, the disclosure of which is incorporated herein in its entirety by reference.

The invention claimed is:

1. A boiling section operable to boil a liquid phase refrigerant with heat from a heating element to change the liquid phase refrigerant in phase into a gaseous phase refrigerant, comprising:
a comb-shaped structure having a bottom portion thermally connected to the heating element and a plurality of fins extending upward from the bottom portion; and
a porous layer, provided on the bottom portion between the fins of the comb-shaped structure, comprising a number of fine particles and a hole between each fine particle, wherein each hole permeates liquid phase refrigerant to forcedly form a thin liquid film configured to receive transferred heat,
wherein each of the plurality of fins have a length that is greater than a thickness of the porous layer,
each of the plurality of fins have a thickness that is equal to or greater than a diameter of each hole,
the thickness of the porous layer is equal to or greater than the diameter of each hole, and
the diameter of each hole is equal to or greater than a diameter of a molecule in the liquid phase refrigerant and equal to or less than an interval between adjacent fins.

2. The boiling section as recited in claim 1, wherein a sidewall surface of each of the plurality of fins has a roughened surface.

3. A heat receiving section comprising the boiling section as recited in claim 1.

4. A cooling apparatus comprising: the heat receiving section as recited in claim 3; a heat radiation section operable to deprive heat from the gaseous phase refrigerant to change the gaseous phase refrigerant in phase into the liquid phase refrigerant; a gaseous phase pipe for transporting the gaseous phase refrigerant in the heat receiving section to the heat radiation section; and a liquid phase pipe for transporting the liquid phase refrigerant in the heat radiation section into the heat receiving section.

5. The cooling apparatus as recited in claim 4, wherein the heat radiation section is located at a position that is vertically upper than a position of the heat receiving section.

6. An electronic device on which the cooling apparatus as recited in claim 4 is mounted.

7. A method of manufacturing a boiling section, the method comprising:
providing a metal block
cutting the metal block and forming a plurality of rising fins from the metal block to produce a comb-shaped structure;
mixing fine particles with a binder to form a mixture;
stacking the mixture on a bottom portion between the fins of the comb-shaped structure; and
sintering the mixture to form a porous layer on the bottom portion of the comb-shaped structure, the porous layer comprising a hole between each fine particle, wherein each hole permeates liquid phase refrigerant to form a thin liquid film configured to receive transferred heat,
wherein each of the plurality of fins have a length that is greater than a thickness of the porous layer,
each of the plurality of fins have a thickness that is equal to or greater than a diameter of each hole,
the thickness of the porous layer is equal to or greater than the diameter of each hole, and
the diameter of each hole is equal to or greater than a diameter of a molecule in the liquid phase refrigerant and equal to or less than an interval between adjacent fins.

8. A method of manufacturing a boiling section, the method comprising:
providing a metal block
cutting the metal block and forming a plurality of rising fins from the metal block to produce a comb-shaped structure;
mixing fine particles with a binder to form a mixture;
sintering the mixture to produce a porous member comprising a hole between each fine particle, wherein each hole permeates liquid phase refrigerant to form a thin liquid film configured to receive transferred heat; and
stacking the porous member on a bottom portion between the fins of the comb-shaped structure to form a porous layer on the bottom portion of the comb-shaped structure,
wherein each of the plurality of fins have a length that is greater than a thickness of the porous layer,
each of the plurality of fins have a thickness that is equal to or greater than a diameter of each hole,
the thickness of the porous layer is equal to or greater than the diameter of each hole, and
the diameter of each hole is equal to or greater than a diameter of a molecule in the liquid phase refrigerant and equal to or less than an interval between adjacent fins.

* * * * *